(12) United States Patent
Sadjadi et al.

(10) Patent No.: US 8,343,876 B2
(45) Date of Patent: Jan. 1, 2013

(54) FAST GAS SWITCHING PLASMA PROCESSING APPARATUS

(75) Inventors: S. M. Reza Sadjadi, Saratoga, CA (US); Zhisong Huang, Fremont, CA (US); Jose Tong Sam, Fremont, CA (US); Eric H. Lenz, Pleasanton, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 17 days.

(21) Appl. No.: 13/189,416

(22) Filed: Jul. 22, 2011

(65) Prior Publication Data

US 2011/0281435 A1 Nov. 17, 2011

Related U.S. Application Data

(60) Division of application No. 11/601,293, filed on Nov. 17, 2006, now abandoned, which is a continuation-in-part of application No. 10/835,175, filed on Apr. 30, 2004, now Pat. No. 7,708,859.

(51) Int. Cl.
*H01L 21/302* (2006.01)

(52) U.S. Cl. ........ 438/706; 438/689; 118/715; 118/729; 156/345.48

(58) Field of Classification Search .................. 438/689, 438/706, 709; 118/719, 729; 156/345.38
See application file for complete search history.

(56) References Cited

U.S. PATENT DOCUMENTS

| | | | |
|---|---|---|---|
| 4,980,204 A | 12/1990 | Fujii et al. | |
| 5,252,178 A | 10/1993 | Moslehi | |
| 5,534,751 A | 7/1996 | Lenz | |
| 5,769,950 A | 6/1998 | Takasu et al. | |
| 5,846,883 A | 12/1998 | Moslehi | |
| 5,879,459 A | 3/1999 | Gadgil et al. | |
| 5,958,140 A | 9/1999 | Arami et al. | |
| 5,972,430 A | 10/1999 | DiMeo, Jr. et al. | |
| 6,008,130 A | 12/1999 | Henderson et al. | |

(Continued)

FOREIGN PATENT DOCUMENTS

DE 10120295 12/2001

(Continued)

OTHER PUBLICATIONS

Search Report dated Oct. 28, 2010 from Singapore Patent Application No. 200903120-4.

(Continued)

*Primary Examiner* — Nadine G Norton
*Assistant Examiner* — Maki Angadi
(74) *Attorney, Agent, or Firm* — Beyer Law Group LLP

(57) ABSTRACT

A plasma chamber with a plasma confinement zone with an electrode is provided. A gas distribution system for providing a first gas and a second gas is connected to the plasma chamber, wherein the gas distribution system can substantially replace one gas in the plasma zone with the other gas within a period of less than 1 s. A first frequency tuned RF power source for providing power to the electrode in a first frequency range is electrically connected to the at least one electrode wherein the first frequency tuned RF power source is able to minimize a reflected RF power. A second frequency tuned RF power source for providing power to the plasma chamber in a second frequency range outside of the first frequency range wherein the second frequency tuned RF power source is able to minimize a reflected RF power.

9 Claims, 7 Drawing Sheets

U.S. PATENT DOCUMENTS

| | | | |
|---|---|---|---|
| 6,013,155 | A | 1/2000 | McMillin et al. |
| 6,174,377 | B1 | 1/2001 | Doering et al. |
| 6,211,092 | B1 | 4/2001 | Tang et al. |
| 6,245,192 | B1 | 6/2001 | Dhindsa et al. |
| 6,270,862 | B1 | 8/2001 | McMillin |
| 6,287,980 | B1 | 9/2001 | Hanazaki et al. |
| 6,387,185 | B2 | 5/2002 | Doering et al. |
| 6,409,876 | B1 | 6/2002 | McQuarrie et al. |
| 6,418,954 | B1 | 7/2002 | Taylor et al. |
| 6,432,831 | B2 | 8/2002 | Dhindsa et al. |
| 6,572,732 | B2 | 6/2003 | Collins |
| 6,602,433 | B1 | 8/2003 | Bhardwaj et al. |
| 6,617,253 | B1 | 9/2003 | Chu et al. |
| 6,620,733 | B2 | 9/2003 | Ho |
| 6,649,469 | B1 | 11/2003 | Wilson |
| 6,774,570 | B2 | 8/2004 | Tsuchiya et al. |
| 6,800,139 | B1 | 10/2004 | Shinriki et al. |
| 6,924,235 | B2 | 8/2005 | Johnson et al. |
| 7,144,521 | B2 | 12/2006 | Rusu et al. |
| 7,520,244 | B2 | 4/2009 | Yamagishi et al. |
| 7,749,353 | B2 | 7/2010 | Rusu et al. |
| 2001/0010257 | A1 | 8/2001 | Ni et al. |
| 2001/0011526 | A1 | 8/2001 | Doering et al. |
| 2001/0047756 | A1 | 12/2001 | Bartholomew et al. |
| 2002/0007794 | A1 | 1/2002 | Byun et al. |
| 2002/0011231 | A1 | 1/2002 | Uneta |
| 2002/0094689 | A1 | 7/2002 | Park |
| 2002/0125223 | A1 | 9/2002 | Johnson et al. |
| 2002/0144655 | A1 | 10/2002 | Chiang et al. |
| 2002/0192369 | A1 | 12/2002 | Morimoto et al. |
| 2003/0029567 | A1 | 2/2003 | Dhindsa et al. |
| 2003/0070620 | A1 | 4/2003 | Cooperberg et al. |
| 2003/0143328 | A1 | 7/2003 | Chen et al. |
| 2003/0151372 | A1* | 8/2003 | Tsuchiya et al. ......... 315/111.81 |
| 2004/0007178 | A1 | 1/2004 | Forrest et al. |
| 2004/0027209 | A1 | 2/2004 | Chen et al. |
| 2004/0050326 | A1 | 3/2004 | Thilderkvist et al. |
| 2004/0103844 | A1 | 6/2004 | Chou et al. |
| 2004/0112538 | A1 | 6/2004 | Larson et al. |
| 2004/0112540 | A1 | 6/2004 | Larson et al. |
| 2004/0118342 | A1 | 6/2004 | Cheng et al. |
| 2004/0194709 | A1 | 10/2004 | Yamagishi et al. |
| 2005/0039682 | A1 | 2/2005 | Dhindsa et al. |
| 2005/0051273 | A1 | 3/2005 | Maeda et al. |
| 2005/0098105 | A1 | 5/2005 | Fuss et al. |
| 2005/0115677 | A1 | 6/2005 | Nagahata et al. |
| 2005/0224178 | A1 | 10/2005 | Puech |
| 2005/0241763 | A1 | 11/2005 | Huang et al. |
| 2007/0066038 | A1 | 3/2007 | Sadjadi et al. |

FOREIGN PATENT DOCUMENTS

| | | |
|---|---|---|
| JP | 2000/195846 A | 7/2000 |
| JP | 2006/286791 A | 10/2006 |
| WO | WO 01/16396 | 3/2001 |
| WO | 2004/008477 | 1/2004 |
| WO | WO2004/017368 | 2/2004 |
| WO | WO 2005/112093 A2 | 11/2005 |

OTHER PUBLICATIONS

Australian Search Report dated Feb. 8, 2007 for SG200606928.
Australian Written Opinion dated Feb. 8, 2007 for SG200606928.
Final Office Action dated Jul. 13, 2009 from U.S. Appl. No. 10/835,175.
Final Office Action dated Jun. 6, 2007 from U.S. Appl. No. 10/835,175.
International Preliminary Report on Patentability dated Dec. 4, 2006 for PCT/US2005/013582.
International Search Report dated Mar. 6, 2008 for International Application No. PCT/US2007/084465.
International Search Report dated Nov. 2, 2006 for PCT/US05/13582.
Notice of Allowance dated Jan. 11, 2010 from U.S. Appl. No. 10/835,175.
Office Action dated Aug. 2, 2010 from Chinese Application No. 200780042683.5.
Office Action dated Dec. 17, 2007 from U.S. Appl. No. 10/835,175.
Office Action dated Dec. 18, 2006 from U.S. Appl. No. 10/835,175.
Office Action dated Jan. 12, 2009 from U.S. Appl. No. 10/835,175.
Office Action dated Jul. 18, 2008 from U.S. Appl. No. 10/835,175.
Supplementary European Search Report dated Feb. 16, 2010 for European Application No. 05738420.8.
Written Opinion dated Mar. 6, 2008 for International Application No. PCT/US2007/084465.
Written Opinion dated Nov. 2, 2006 for PCT/US05/13582.
Written Opinion dated Oct. 28, 2010 from Singapore Patent Application No. 200903120-4.
Office Action dated Mar. 9, 2010 from U.S. Appl. No. 11/601,293.
Final Office Action dated Jul. 14, 2010 from U.S. Appl. No. 11/601,293.
Office Action dated Dec. 28, 2010 from U.S. Appl. No. 11/601,293.
Final Office Action dated May 24, 2011 from U.S. Appl. No. 11/601,293.

* cited by examiner

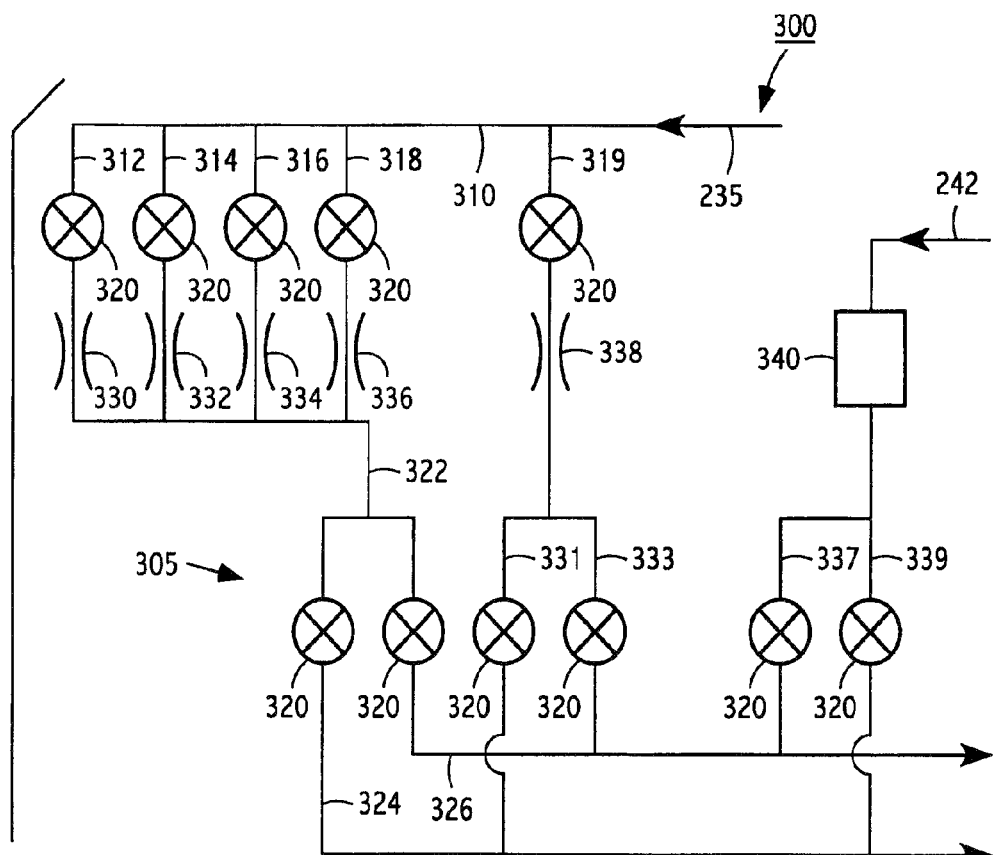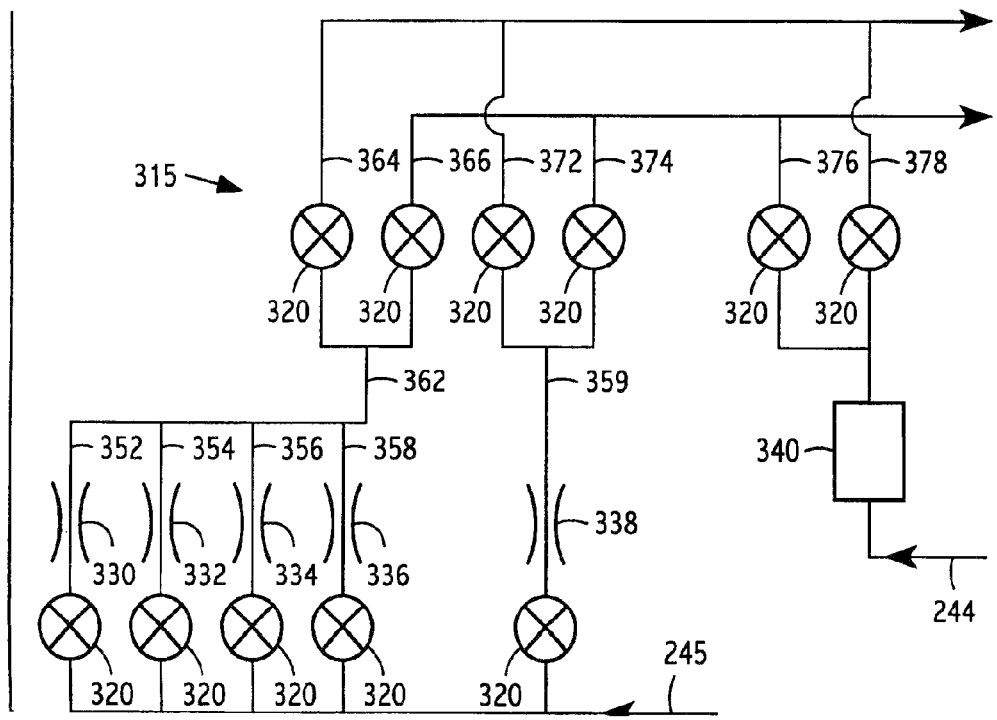
FIG. 4

FAST GAS SWITCHING PLASMA PROCESSING APPARATUS

RELATED APPLICATIONS

This application is a divisional of U.S. patent application Ser. No. 11/601,293 filed on Nov. 17, 2006, which is a Continuation-In-Part of U.S. application Ser. No. 10/835,175 filed on Apr. 30, 2004, now U.S. Pat. No. 7,708,859, issued on May 4, 2010, entitled "GAS DISTRIBUTIONS SYSTEM HAVING FAST GAS SWITCHING CAPABILITIES", which are hereby incorporated by reference in their entirety.

BACKGROUND

Semiconductor structures are processed in plasma processing apparatuses including a plasma processing chamber, a gas source that supplies process gas into the chamber, and an energy source that produces plasma from the process gas. Semiconductor structures are processed in such apparatuses by techniques including dry etching processes, deposition processes, such as chemical vapor deposition (CVD), physical vapor deposition, or plasma-enhanced chemical vapor deposition (PECVD) of metal, dielectric and semiconductor materials and resist stripping processes. Different process gases are used for these processing techniques, as well as processing different materials of semiconductor structures.

SUMMARY

To achieve the foregoing and in accordance with the purpose of the present invention, a plasma wafer processing tool is provided. A plasma chamber with a plasma confinement zone with a volume and at least one electrode is provided. A gas distribution system for providing a first gas and a second gas is connected to the plasma chamber, wherein the gas distribution system can substantially replace one of the first gas and the second gas in the plasma zone with the other of the first gas and the second gas within a period of less than 1 s, wherein a first plasma formed in the plasma zone from the first gas provides a first impedance load and wherein a second plasma formed in the plasma zone from the second gas provides a second impedance load different than the first impedance load. A first frequency tuned RF power source for providing power to the at least one electrode in a first frequency range is electrically connected to the at least one electrode wherein the first frequency tuned RF power source is able to receive reflected RF power and tune an output RF frequency to minimize the reflected RF power. A second frequency tuned RF power source for providing power to the plasma chamber in a second frequency range outside of the first frequency range wherein the second frequency tuned RF power source is able to receive reflected RF power and tune an output RF frequency to minimize the reflected RF power.

In another manifestation of the invention a plasma processing apparatus is provided. A plasma processing chamber including a showerhead electrode assembly having the inner and outer zones and an interior volume of about ½ liter to 4 liters is provided. A gas distribution system is in fluid communication with the inner and outer zones of the showerhead electrode assembly, wherein the gas distribution system is operable to substantially replace a first process gas or a second process gas in the plasma confinement zone with the other of the first process gas or the second process gas within a period of less than about 1 s. The gas distribution comprises a gas supply system, which provides the first process gas and the second process gas, a flow control system in fluid communication with the gas supply system, which splits a flow of the first process gas into an inner zone flow of the first process gas and an outer zone flow of the first process gas and which splits a flow of the second process gas into an inner zone flow of the second process gas and an outer zone flow of the second process gas, and a switching section, which is in fluid connection between the flow control system and the inner zone and outer zone of the gas distribution member, wherein the switching section switches flow to the inner zone of the gas distribution member between the inner zone flow of the first process gas and the inner zone of the second process gas and wherein the switching section switches flow to the outer zone of the gas distribution member between the outer zone flow of the first process gas and the outer zone flow of the second process gas. A first frequency tuned RF power source for provides power to the plasma processing apparatus in a first frequency range wherein the first frequency tuned RF power source is able to receive reflected RF power and tune an output RF frequency to minimize the reflected RF power. A second frequency tuned RF power source for provides power to the plasma processing apparatus in a second frequency range outside of the first frequency range wherein the second frequency tuned RF power source is able to receive reflected RF power and tune an output RF frequency to minimize the reflected RF power.

In another manifestation of the invention, a method of processing a semiconductor structure in a plasma processing chamber is provided. a) A first process gas is supplied into the plasma processing chamber while diverting a second process gas to a bypass-line, the plasma processing chamber containing a semiconductor substrate including at least one layer and a patterned resist mask overlying the layer. b) The first process gas is energized to produce a first plasma with a first impedance load and (i) etching at least one feature in the layer or (ii) forming a polymer deposit on the mask. c) A first RF power source is frequency tuned to a first frequency to match the first impedance load. d) A second RF power source is frequency tuned to a second frequency different than the first frequency to match the first impedance load. e) The flows of the first and second process gases are switched so that the second process gas is supplied into the plasma processing chamber while diverting the first process gas to the by-pass line, the first process gas being substantially replaced in a plasma confinement zone of the plasma processing chamber by the second process gas within a period of less than about 1 s. f) The second process gas is energized to produce a second plasma with a second impedance load different from the first impedance load and (iii) etching the at least one feature in the layer or (iv) forming a polymer deposit on the layer and the mask. g) The first RF power source is frequency tuned to a third frequency different than the first and second frequencies to match the second impedance load. h) The second RF power source is frequency tuned to a fourth frequency different than the first, second, and third frequencies to match the second impedance load. i) The flows of the first and second process gases are switched so that the first process gas is supplied into the plasma processing chamber while diverting the second process gas to the by-pass line, the second process gas being substantially replaced in the plasma confinement zone of the plasma processing chamber by the first process gas within a period of less than about 1 s. j) Steps b)-i) are repeated a plurality of times with the substrate.

These and other features of the present invention will be described in more details below in the detailed description of the invention and in conjunction with the following figures.

BRIEF DESCRIPTION OF THE DRAWING FIGURES

The present invention is illustrated by way of example, and not by way of limitation, in the figures of the accompanying drawings and in which like reference numerals refer to similar elements and in which:

FIG. 1 is a sectional view of an exemplary embodiment of a plasma processing apparatus that preferred embodiments of the gas distribution system can be used with.

FIG. 4 depicts a preferred embodiment of a flow control section of the gas distribution system.

DETAILED DESCRIPTION

Figure 1:
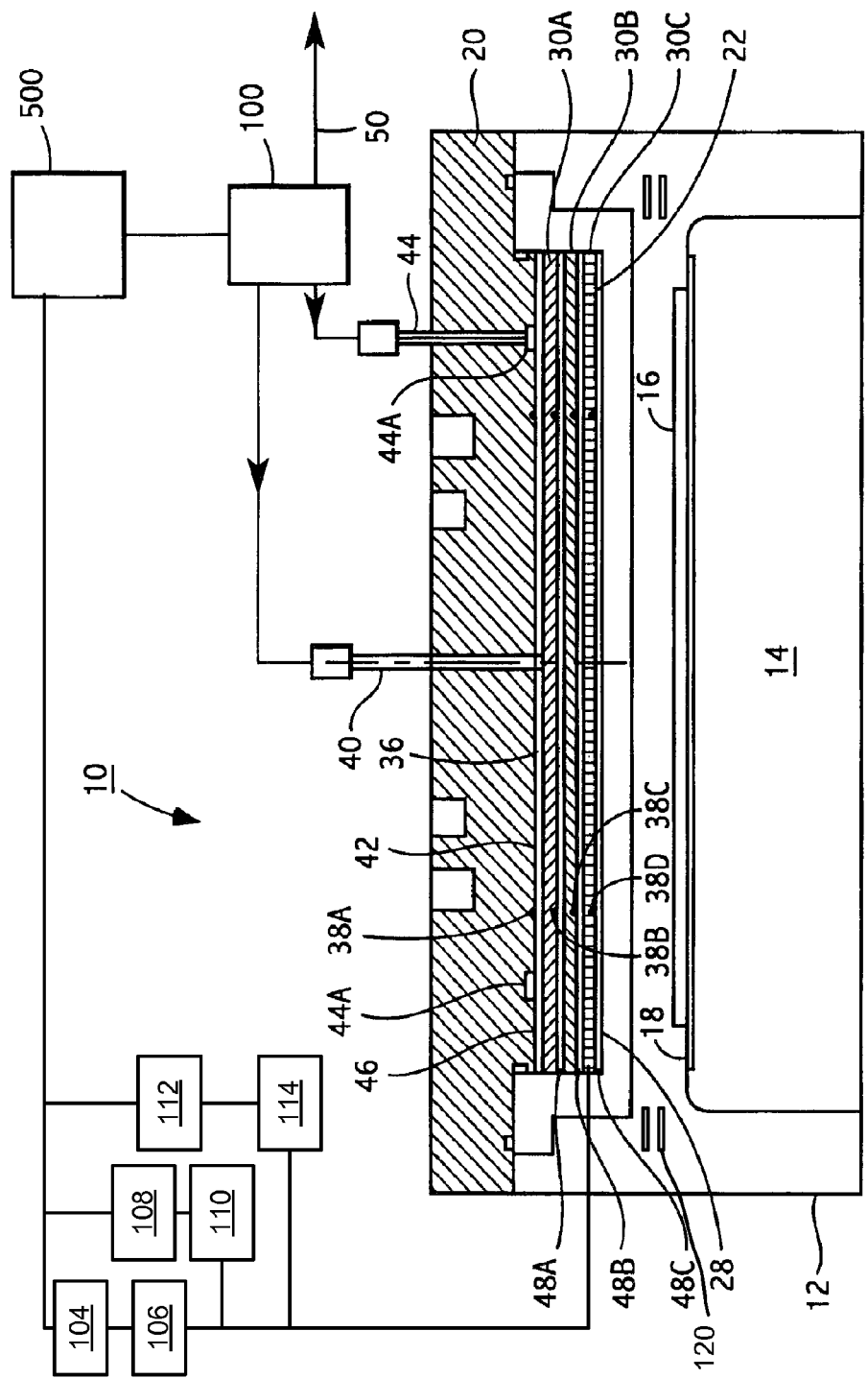

Plasma processing apparatuses for processing semiconductor materials, such as semiconductor devices formed on semiconductor substrates, e.g., silicon wafers, include a plasma processing chamber and a gas distribution system that supplies process gas into the plasma processing chamber. The gas distribution system can distribute gas to a single zone or multiple zones across the surface of a substrate during plasma processing. The gas distribution system can include flow controllers to control the flow ratio of the same or different process gas, or gas mixture, to the zones, thereby allowing in-process adjustment of across-substrate uniformity of gas flow and gas composition.

Although multiple-zone gas distribution systems can provide improved flow control as compared to a single-zone system, it may be desirable to provide such systems with an arrangement that allows substrate processing operations in which the gas composition and/or the gas flow can be changed within a short period of time.

A gas distribution system is provided for supplying different gas compositions and/or flow ratios to a chamber. In a preferred embodiment, the gas distribution system is adapted to be in fluid communication with an interior of a vacuum chamber, such as a plasma processing chamber of a plasma processing apparatus, and provide the capability of supplying different gas chemistries and/or gas flow rates to the vacuum chamber during processing operations. The plasma processing apparatus can be a low-density, medium-density or high-density plasma reactor including an energy source that uses RF energy, microwave energy, magnetic fields, or the like to produce plasma. For example, the high-density plasma can be produced in a transformer coupled plasma (TCP™) reactor, also known as an inductively coupled plasma reactor, an electron-cyclotron resonance (ECR) plasma reactor, a capacitive-type discharge, or the like. Exemplary plasma reactors that preferred embodiments of the gas distribution system can be used with include Exelan™ plasma reactors, such as the 2300 Excelan™ plasma reactor, available from Lam Research Corporation, located in Fremont, Calif. During plasma etching processes, multiple frequencies can be applied to a substrate support incorporating an electrode and an electrostatic chuck. Alternatively, in dual-frequency plasma reactors, different frequencies can be applied to the substrate support and an electrode, such as a showerhead electrode, spaced from the substrate.

A preferred embodiment of the gas distribution system can supply a first gas into the interior of a vacuum chamber, such as a plasma processing chamber, via a single zone or multiple zones, preferably at least an inner zone and an outer zone of a gas distribution member adjacent to an exposed surface of a substrate to be processed. The inner and outer zones are radially spaced, and preferably, flow insulated, from each other in the plasma processing chamber. The gas distribution system can simultaneously divert a second gas that is different from the first gas to a vacuum chamber by-pass line. The by-pass line can be in fluid communication with a vacuum pump, or the like. In a preferred embodiment, the first gas is a first process gas and the second gas is a different process gas. For example, the first gas can be a first etch gas chemistry or deposition gas chemistry, and the second gas can be a different etch gas chemistry or deposition gas chemistry. The gas distribution system can simultaneously provide different controlled flow rates of the first gas to the inner zone and the outer zone, respectively, while the second gas is diverted to the by-pass line, and vice versa. By diverting one of the gases to the by-pass line, change over of the gas supplied to the vacuum chamber can be achieved within a short period of time.

The gas distribution system includes switching devices that allow gas switching, or gas change over, in a short period of time between first and second gases supplied to an interior of a vacuum chamber that includes a single zone or includes multiple zones. For multiple-zone systems, the gas distribution system can supply the first gas to the inner zone and outer zone while the second gas is diverted to the by-pass line, and then switch the gas distributions within a short period of time so that the second gas is supplied to the inner zone and outer zone while the first gas is diverted to the by-pass line. The gas distribution system can alternately supply the first and second gases into the interior of the vacuum chamber, each for a desired period of time to allow quick change over between different processing operations that use different gas chemistries, e.g., alternating steps of a method of processing a semiconductor device. In a preferred embodiment, the method steps can be different etch steps, e.g., a faster etch step, such as a main etch, and a relatively slower etch step, such as an over etch step; an etch step and a material deposition step; or different material deposition steps that deposit different materials onto a substrate.

In a preferred embodiment of the gas distribution system, a volume of a gas composition in a confined region within a vacuum chamber, preferably a plasma confinement zone, can be replaced (i.e., flushed out) by another gas composition introduced into the vacuum chamber within a short period of time. Such gas replacement preferably can be achieved in less than about 1 s, more preferably within less than about 200 ms, by providing valves having a fast switching capability in the gas distribution system. The plasma confinement zone can have a gas volume of about ½ liter to about 4 liters for a plasma processing chamber for processing 200 mm or 300 mm wafers. The plasma confinement zone can be defined by a stack of confinement rings, such as disclosed in commonly-owned U.S. Pat. No. 5,534,751, which is hereby incorporated by reference in its entirety.

FIG. 1 depicts an exemplary semiconductor material plasma processing apparatus 10 that embodiments of the gas distribution system 100 can be used with. The apparatus 10 comprises a vacuum chamber or plasma processing chamber 12 having an interior containing a substrate support 14 on which a substrate 16 is supported during plasma processing.

The substrate support 14 includes a clamping device, preferably an electrostatic chuck 18, which is operable to clamp the substrate 16 on the substrate support 14 during processing. The substrate can be surrounded by focus rings and/or edge rings, ground extensions or other parts, such as parts disclosed in commonly-owned U.S. Patent Application Publication No. US 2003/0029567, which is incorporated herein by reference in its entirety.

In a preferred embodiment, the plasma processing chamber 12 includes a plasma confinement zone having a volume of about ½ liter to about 4 liters, preferably about 1 liter to about 3 liters. For example, the plasma processing chamber 12 can include a confinement ring arrangement, such as disclosed in commonly-owned U.S. Pat. No. 5,534,751, which is incorporated herein by reference in its entirety, to define the plasma confinement zone. The gas distribution system can replace such a volume of gas in the plasma confinement zone with another gas within a period of less than about 1 s, preferably in less than about 200 ms, without substantial back diffusion. A confinement mechanism, such as confinement rings 120, can limit the fluid communication from the plasma volume to portions of the interior of the plasma processing chamber 12 that are outside of the plasma volume.

The substrate 16 may include a base material, such as a silicon wafer; an intermediate layer of a material that is to be processed, e.g., etched, over the base material; and a masking layer over the intermediate layer. The intermediate layer may be of a conductive, dielectric, or semiconductive material. The masking layer can be patterned photoresist material having an opening pattern for etching desired features, e.g., holes, vias and/or trenches, in the intermediate layer and/or one or more other layers. The substrate can include additional layers of conductive, dielectric or semiconductive materials between the base layer and the masking layer, depending on the type of semiconductor device formed on the base material.

Exemplary dielectric materials that can be processed are, for example, doped silicon oxide, such as fluorinated silicon oxide; un-doped silicon oxide, such as silicon dioxide; spin-on glass; silicate glasses; doped or un-doped thermal silicon oxide; and doped or un-doped TEOS deposited silicon oxide. Such dielectric materials can overlie a conductive or semiconductive layer, such as polycrystalline silicon; metals, such as aluminum, copper, titanium, tungsten, molybdenum and their alloys; nitrides, such as titanium nitride; and metal silicides, such as titanium silicide, tungsten silicide and molybdenum silicide.

The exemplary plasma processing apparatus 10 shown in FIG. 1 includes a showerhead electrode assembly having a support plate 20 forming a wall of the plasma chamber, and a showerhead 22 attached to the support plate. A baffle assembly is located between the showerhead 22 and the support plate 20 to uniformly distribute process gas to a backside 28 of the showerhead. The baffle assembly can include one or more baffle plates. In the embodiment, the baffle assembly includes baffle plates 30A, 30B, and 30C. Open plenums 48A, 48B and 48C are defined between the baffle plates 30A, 30B and 30C; and between the baffle plate 30C and showerhead 22. The baffle plates 30A, 30B and 30C and showerhead 22 include through passages for flowing process gas into the interior of plasma processing chamber 12.

A first frequency tuned RF power source 104 is controllably connected to a controller 500 and provides power to the showerhead electrode 22 through a first mechanical match box 106. The first frequency tuned RF power source 104 provides a variable frequency, which in this embodiment ranges from 1.7 MHz to 2.2 MHz, so that 2 MHz lies within the variable frequency range The first frequency tuned RF power source is formed to receive and measure output power and reflected RF power and to vary the frequency in the frequency range of 1.7 MHz to 2.2 MHz to minimize reflected RF power from the first frequency tuned RF power source 104.

A second frequency tuned RF power source 108 is controllably connected to a controller 500 and provides power to the showerhead electrode 22 through a second mechanical match box 110. The second frequency tuned RF power source 108 provides a variable frequency, which in this embodiment ranges from 26.7 MHz to 27.2 MHz, so that 27 MHz lies within the variable frequency range. The second frequency tuned RF power source is formed to receive and measure output power and reflected RF power and to vary the frequency in the frequency range of 26.7 MHz to 27.2 MHz to minimize reflected RF power from the second frequency tuned RF power source 108.

A third frequency tuned RF power source 112 is controllably connected to a controller 500 and provides power to the showerhead electrode 22 through a third mechanical match box 114. The third frequency tuned RF power source 112 provides a variable frequency, which in this embodiment ranges from 59.7 MHz to 60.2 MHz, so that 60 MHz lies within the variable frequency range. The third frequency tuned RF power source 112 is formed to receive and measure output power and reflected RF power and to vary the frequency in the frequency range of 59.7 MHz to 60.2 MHz to minimize reflected RF power from the third frequency tuned RF power source 112.

In this example, the first, second, and third frequency tuned RF power sources vary the frequency over a range of 0.5 MHz to provide RF tuning. In other embodiments, the frequency tuned RF power sources vary the frequency over a range of less than 2 MHz. More preferably, the frequency tuned RF power sources vary the frequency over a range of less than 1 MHz. The tuning range should be large enough to minimize reflected power and yet small enough to allow fast tuning.

In the embodiment, the plenum between the plate 20 and the baffle plate 30A and the plenums 48A, 48B and 48C between the baffle plates 30A, 30B and 30C are divided into an inner zone 42 and an outer zone 46 by seals 38a, 38b, 38c and 38d, such as O-rings. The inner zone 42 and outer zone 46 can be supplied process gas having different respective gas chemistries and/or flow rates by the gas distribution system 100, preferably under control of the controller 500. Gas is supplied from an inner zone gas supply 40 into the inner zone 42, and gas is supplied from an outer zone gas supply 44 into an annular channel 44a and then into the outer zone 46. The process gas flows through the passages in the baffle plates 30A, 30B and 30C and the showerhead 22 and into the interior of the plasma processing chamber 12.

In other preferred embodiments, the plasma processing apparatus 10 can include a gas injector system for injecting process gas into the plasma processing chamber. For example, the gas injector system can have a configuration as disclosed in commonly-owned U.S. patent application Ser. No. 09/788,365, U.S. patent application Ser. No. 10/024,208, U.S. Pat. No. 6,013,155, or U.S. Pat. No. 6,270,862, each of which is incorporated herein by reference in its entirety.

The process gas is energized into the plasma state in the plasma processing chamber 12 by a power source, such as an RF source driving electrode 22, or a power source driving an electrode in the substrate support 14. The RF power applied to the electrode 22 can be varied when different gas compositions are supplied into the plasma processing chamber 12, preferably within a time period of less than about 1 s, more preferably less than about 200 ms. The change in gas compositions can change the load or impedance from the gas. The first, second, and third RF power sources 104, 108, 112 may have mechanical impedance matching devices, but such devices may not be fast enough to match the changing impedance when different gas compositions are provided for time periods less than about 1 s. Therefore, the first, second, and third RF power sources have variable frequencies and are able to measure output and reflected RF power and to vary the frequency to minimize reflected RF power. The minimizing the reflected RF power matches the impedance of the load from the plasma in the processing chamber with the RF power sources through a matchbox.

Figure 2:
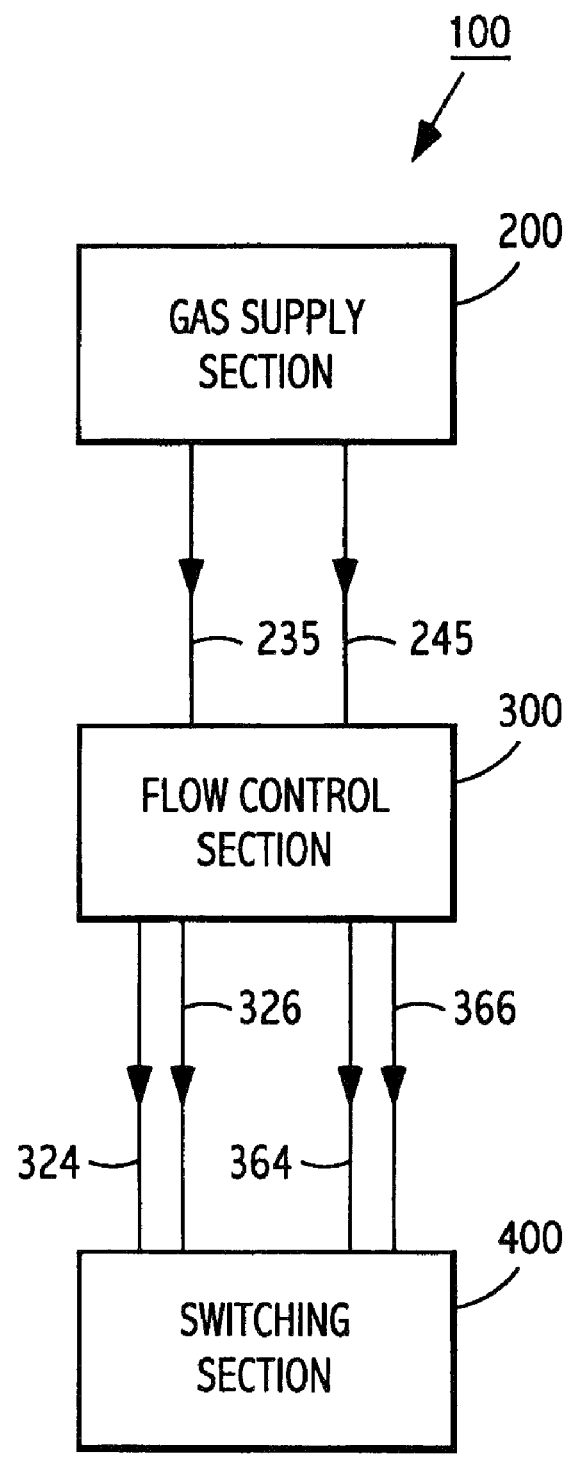
FIG. 2 illustrates a preferred embodiment of the gas distribution system.

FIG. 2 shows a preferred embodiment in which the gas distribution system 100 includes a gas supply section 200, a flow control section 300, and a gas switching section 400 in fluid communication with each other. The gas distribution system 100 preferably also includes a controller 500 (FIG. 1), which is connected in control communication to control operation of the gas supply section 200, flow control section 300 and gas switching section 400.

In the gas distribution system 100, the gas supply section 200 can supply different gases, such as first and second process gases, to the flow control section 300 via respective first and second gas lines 235, 245. The first and second gases can have different compositions and/or gas flow rates from each other.

The flow control section 300 is operable to control the flow rate, and optionally also to adjust the composition, of different gases that can be supplied to the switching section 400. The flow control section 300 can provide different flow rates and/or chemistries of the first and second gases to the switching section 400 via gas passages 324, 326 and 364, 366, respectively. In addition, the flow rate and/or chemistry of the first gas and/or second gas that is supplied to the plasma processing chamber 12 (while the other gas is diverted to by-pass line 50, which can be in fluid communication with a vacuum pumping system, such as between a turbo pump and a roughing pump) can be different for the inner zone 42 and the outer zone 46. Accordingly, the flow control section 300 can provide desired gas flows and/or gas chemistries across the substrate 16, thereby enhancing substrate processing uniformity.

In the gas distribution system 100, the switching section 400 is operable to switch from the first gas to the second gas within a short period of time to allow the first gas to be replaced by the second gas in a single zone or multiple zones, e.g., the inner zone 42 and the outer zone 46, while simultaneously diverting the first gas to the by-pass line, or vice versa. The gas switching section 400 preferably can switch between the first and second gases without the occurrence of undesirable pressure surges and flow instabilities in the flow of either gas. If desired, the gas distribution system 100 can maintain a substantially constant sequential volumetric flow rate of the first and second gases through the plasma processing chamber 12.

Figure 3:
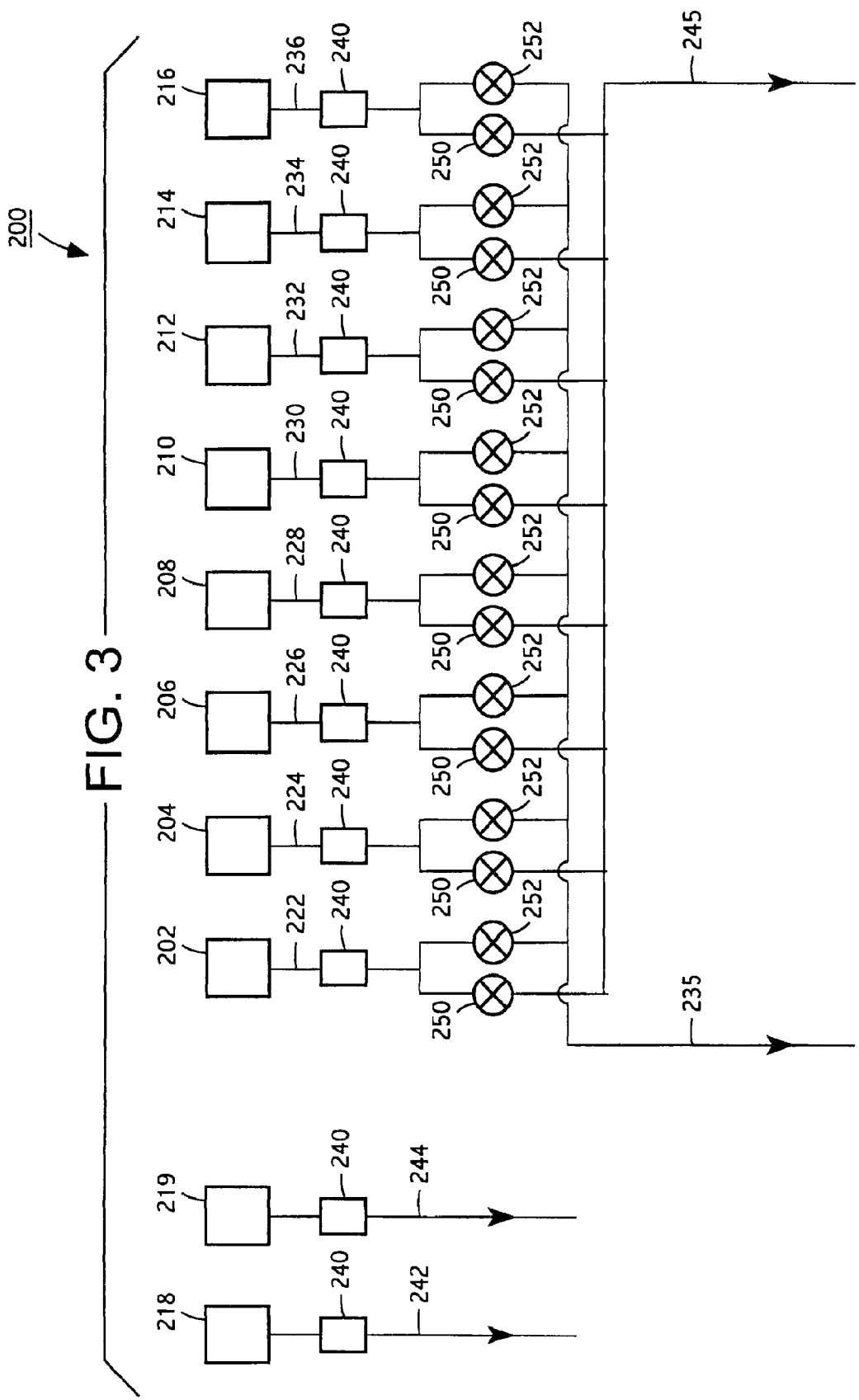
FIG. 3 depicts a preferred embodiment of a gas supply section of the gas distribution system.

FIG. 3 shows a preferred embodiment of the gas supply section 200 of the gas distribution system 100. The gas supply section 200 is preferably connected to the controller 500 to control operation of flow control components, such as valves and flow controllers, to allow control of the composition of two or more gases that can be supplied by the gas supply section 200. In the embodiment, the gas supply section 200 includes multiple gas sources 202, 204, 206, 208, 210, 212, 214 and 216, each being in fluid communication with the first gas line 235 and the second gas line 245. As such, the gas supply section 200 can supply many different desired gas mixtures to the plasma processing chamber 12. The number of gas sources included in the gas distribution system 100 is not limited to any particular number of gas sources, but preferably includes at least two different gas sources. For example, the gas supply section 200 can include more than or less than the eight gas sources included in the embodiment shown in FIG. 3. For example, the gas supply section 200 can include two, three, four, five, ten, twelve, sixteen, or more gas sources. The different gases that can be provided by the respective gas sources include individual gases, such as $O_2$, Ar, $H_2$, $Cl_2$, $N_2$ and the like, as well as gaseous fluorocarbon and/or fluorohydrocarbon compounds, such as $CF_4$, $CH_3F$ and the like. In one preferred embodiment, the plasma processing chamber is an etch chamber and the gas sources 202-216 can supply Ar, $O_2$, $N_2$, $Cl_2$, $CH_3$, $CF_4$, $C_4F_8$ and $CH_3F$ or $CHF_3$ (in any suitable order thereof). The particular gases supplied by the respective gas sources 202-216 can be selected based on the desired process that is to be performed in the plasma processing chamber 12, e.g., particular dry etching and/or material deposition processes. The gas supply section 200 can provide broad versatility regarding the choice of gases that can be supplied for performing etching processes and/or material deposition processes.

The gas supply section 200 preferably also includes at least one tuning gas source to adjust the gas composition. The tuning gas can be, e.g., $O_2$, an inert gas, such as argon, or a reactive gas, such as a fluorocarbon or fluorohydrocarbon gas, e.g., $C_4F_8$. In the embodiment shown in FIG. 3, the gas supply section 200 includes a first tuning gas source 218 and a second tuning gas source 219. As described below, the first tuning gas source 218 and second tuning gas source 219 can supply tuning gas to adjust the composition of the first and/or second gas supplied to the gas switching section 400.

In the embodiment of the gas supply section 200 shown in FIG. 3, a flow control device 240 preferably is disposed in each of the gas passages 222, 224, 226, 228, 230, 232, 234 and 236 in fluid communication with the gas sources 202, 204, 206, 208, 210, 212, 214 and 216, respectively, and also in the gas passages 242, 244 in fluid communication with the first tuning gas source 218 and the second tuning gas source 219, respectively. The flow control devices 240 are operable to control the flow of the gas supplied by the associated gas sources 202-216 and 218, 219. The flow control devices 240 preferably are mass flow controllers (MFCs).

In the embodiment shown in FIG. 3, valves 250, 252 are located along the gas passages downstream of each of the gas sources 202-216. The valves 250, 252 can be selectively opened or closed, preferably under control of the controller 500, to allow different gas mixtures to be flowed to the first gas line 235 and/or the second gas line 245. For example, by opening the valves 252 associated with one or more of the gas sources 202-216 (while the remaining valves 252 associated with the other ones of the gas sources 202-216 are closed), a first gas mixture can be supplied to the first gas line 235. Likewise, by opening the valves 250 associated with one or more of the other gas sources 202-216 (while the remaining valves 250 associated with the other ones of the gas sources 202-216 are closed), a second gas mixture can be supplied to the second gas line 245. Accordingly, various mixtures and mass flow rates of the first and second gases can be provided to the first gas line 235 and the second gas line 245 by controlled operation of the gas supply section 200.

In a preferred embodiment, the gas supply section 200 is operable to provide a continuous flow of the first and second gases via the first gas line 235 and the second gas line 245, respectively. The first gas or the second gas is flowed to the plasma processing chamber 12 while the other gas is diverted to the by-pass line. The by-pass line can be connected to a vacuum pump, or the like. By continuously flowing both of the first and second gases, the gas distribution system 100 can achieve rapid change over of the gas flow.

FIG. 4 shows a preferred embodiment of the flow control section 300 of the gas distribution system 100. The flow control section 300 includes a first flow control section 305 in fluid communication with the first gas line 235 from the gas supply section 200, and a second flow control section 315 in fluid communication with the second gas line 245 from the gas supply section 200. The flow control section 300 is operable to control the ratio of the first gas supplied to the inner zone 42 and outer zone 46, respectively, while the second gas is diverted to the by-pass line, and to control the ratio of the second gas supplied to the inner zone 42 and outer zone 46, respectively, while the first gas is diverted to the by-pass line. The first flow control section 305 divides the flow of the first gas introduced at the first gas line 235 into two separate outlet flows of the first gas, and the second flow control section 315 divides the flow of the second gas introduced at the second gas line 245 into two separate outlet flows of the second gas. The first flow control section 305 includes first and second gas passages 324, 326 in fluid communication with the inner zone 42 and outer zone 46, respectively, via the switching system 400, and the second flow control section 315 includes first and second gas passages 364, 366 in fluid communication with the inner zone 42 and outer zone 46, respectively, via the switching system 400.

In a preferred arrangement, the first flow control section 305 and the second flow control section 315 each include at least two flow restrictors. Each flow restrictor preferably has a fixed restriction size for gas flow through it. The flow restrictors are preferably orifices. The flow restrictors restrict gas flow and maintain an approximately constant gas pressure in a region of the gas passages upstream of and proximate the orifices. Each of the first flow control section 305 and the second flow control section 315 preferably includes a network of orifices, e.g., two, three, four, five or more orifices, each preferably having a different cross-sectional restriction size, e.g., a different diameter or a different cross-sectional area. The restriction sizes of the orifices are smaller than the cross-sectional areas of the other portions of the gas flow path of the gas distribution system 100. The orifices are preferably sonic orifices. The gas flows are preferably operated at the critical flow regime in the flow control section 300 so that the flow conductance of a given orifice is determined solely by its restriction size and upstream pressure. As the flow conductance of an orifice increases, the pressure drop across the orifice to achieve a given flow rate through the orifice decreases.

In the embodiment shown in FIG. 4, the first and second flow control sections 305, 315 each include five orifices 330, 332, 334, 336 and 338. For example, the orifices 330, 332, 334, 336 and 338 can have relative restriction sizes, e.g., diameters, of one, two, four, eight, and sixteen, respectively. Accordingly, when gas flow occurs through all five orifices 330-338, the four orifices 330-336 have approximately the same total conductance as that of the single orifice 338. Alternatively, up to three of the four orifices 330-336 can be opened to provide different ratios of the total conductance of the orifices 330-336 as compared to the conductance of the orifice 338, in order to supply different ratios of the first gas flow and the second gas flow to the inner zone 42 and the outer zone 46. Another embodiment can include a different number of orifices, e.g., a total of two orifices; including the orifice 338 and a second orifice that replaces the multiple orifices 330-336. The second orifice preferably has the same restriction size as the orifice 338. In such embodiment, the flow ratio of the first gas and/or second gas supplied to the inner zone 42 and the outer zone 46 is approximately 1:1.

Valves 320 preferably are located upstream of each of the respective orifices 330-338 to control the flow of the first and second gases to the orifices. For example, in the first flow control section 305 and/or the second flow control section 315, one or more of the valves 320 can be opened to allow flow of the first gas and/or second gas to one or more of the associated orifice(s) 330-336, while the other valve 320 is opened to allow flow of the first gas and/or the second gas to the orifice(s) 338.

In the first flow control section 305, the orifices 330-336 are in fluid communication with the gas passage 322. The gas passage 322 is divided into the first and second gas passages 324, 326, which are in fluid communication with the gas switching section. A pair of valves 320 is located in the first and second gas passages 324, 326 to control flow of the first gas flowed through one or more of the orifices 330-336 of the first flow control section 305 to the inner zone 42 and/or the outer zone 46. In an alternative embodiment, the pair of valves 320 located along the gas passages 324, 326 can be replaced by a single, four-way valve.

In the first flow control section 305, the orifice 338 is arranged along the gas passage 319. The gas passage 319 is divided into gas passages 331, 333, which are in fluid communication with the first and second gas passages 324, 326, respectively. A pair of valves 320 is located in the gas passages 331, 333 to control flow of the first gas flowed through the orifice 338 to the first and second gas passages 324, 326. In an alternative embodiment, the pair of valves 320 located along the gas passages 331, 333 can be replaced by a single, four-way valve.

In the second flow control section 315, a pair of valves 320 is located along the first and second gas passages 364, 366 to control flow of the second gas flowed through one or more of the orifices 330-336 to the inner zone 42 and the outer zone 46 of the plasma processing chamber. In an alternative embodiment, the pair of valves 320 located along the gas passages 364, 366 can be replaced by a single, four-way valve.

In the second flow control section 315, the orifice 338 is arranged along the gas passage 359. The gas passage 359 is divided into gas passages 372, 374, which are in fluid communication with the first and second gas passages 364, 366, respectively. A pair of valves 320 is located in the gas passages 372, 374 to control flow of the second gas flowed through the orifice 338 to the first and/or second gas passages 364, 366. In an alternative embodiment, the pair of valves 320 located along the gas passages 372, 374 can be replaced by a single four-way valve.

The orifices 330-338 are included in the flow control section 300 to prevent pressure surges and flow instabilities in the gas flow when the gas distribution system 100 changes the gas flowed into the plasma processing chamber 12 from the first gas to the second gas, and vice versa.

In the embodiment shown in FIG. 4, the gas passage 242 of the first tuning gas source 218 (FIG. 3) is arranged to supply the first tuning gas to the first gas passage 324 and/or second gas passage 326 of the first flow control section 305 to adjust the first gas composition. The gas passage 244 of the second tuning gas source 219 (FIG. 3) is arranged to supply the second tuning gas to the first gas passage 364 and/or second gas passage 366 of the second flow control section 315 to adjust the second gas composition. The first and second tuning gases can be the same tuning gas or different tuning gases.

A flow control device 340, preferably an MFC, is arranged along the gas passage 242. Valves 320 are located along the gas passages 337, 339 to control flow of the first tuning gas into the gas passage 326, 324, respectively. In an alternative embodiment, the pair of valves 320 located along the gas passages 337, 339 can be replaced by a single, four-way valve.

A flow control device 340, preferably an MFC, is arranged along the gas passage 244. Valves 320 are located along the gas passages 376, 378 to control flow of the second tuning gas into the gas passages 366, 364, respectively. In an alternative embodiment, the pair of valves 320 located along the gas passages 376, 378 can be replaced by a single, four-way valve.

In the embodiment of the flow control section 300 shown in FIG. 4, the first flow control section 305 and the second flow control section 315 include the same components arranged in the same configuration. However, in other preferred embodiments of the gas distribution system 100, the first and second flow control sections 305, 315 can have different components and/or different configurations from each other. For example, the first and second flow control sections 305, 315 can include different numbers of orifices and/or orifices with different restriction sizes from each other.

Figure 5:
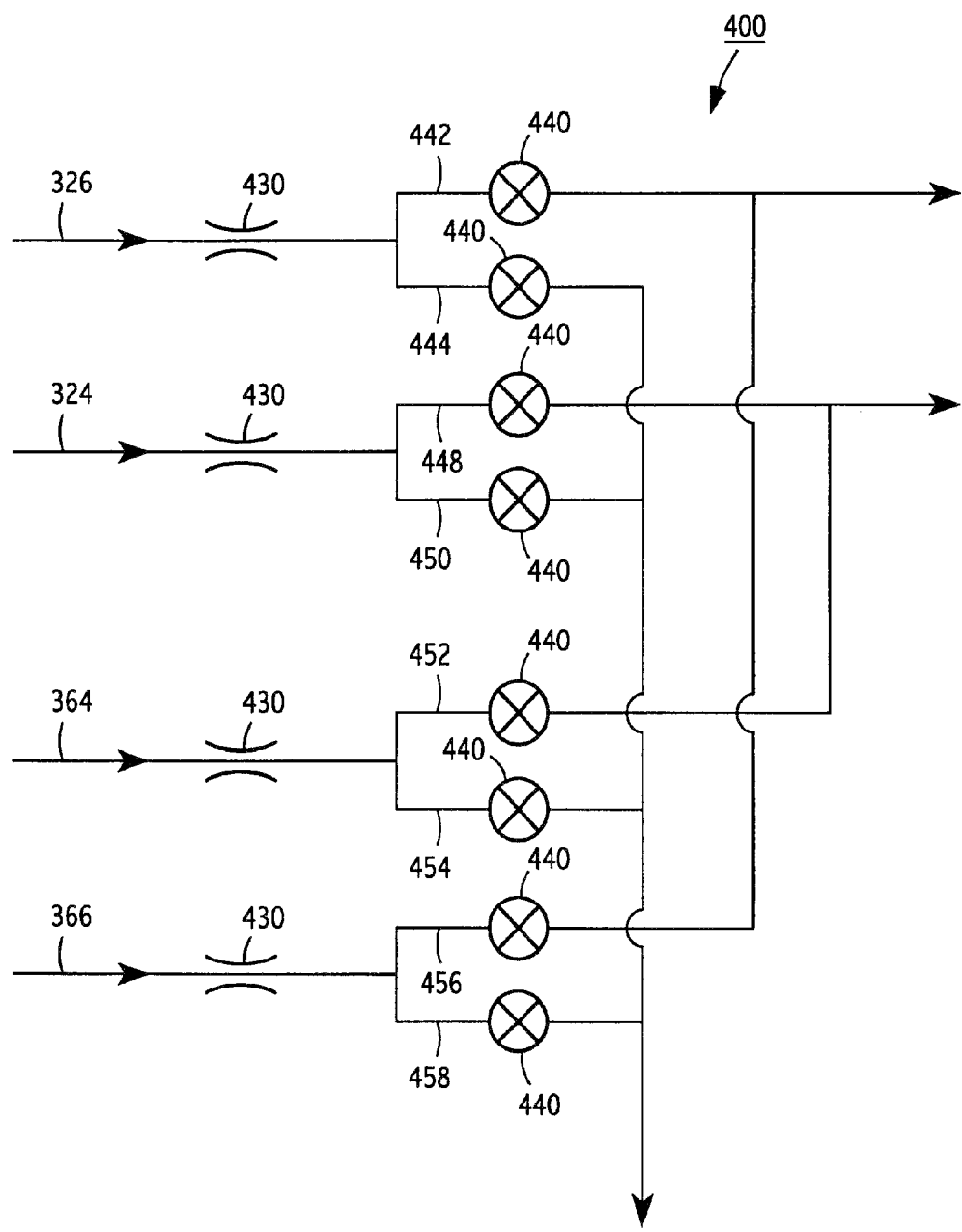
FIG. 5 depicts a first preferred embodiment of a gas switching section of the gas distribution system.

In the gas distribution system 100, the gas switching system 400 is in fluid communication with the flow control section 300, and with the interior of the vacuum chamber and the by-pass line to which the first and second gases are flowed. A first preferred embodiment of the gas switching system 400 is depicted in FIG. 5. The gas switching system 400 can alternately supply first and second gases to both the inner zone 42 and the outer zone 46 of the plasma processing chamber 12. The gas switching system 400 is in fluid communication with the first gas passage 324 and the second gas passage 326 of the first flow control section 305, and with the first gas passage 364 and the second gas passage 366 of the second flow control section 315. An orifice 430 is arranged along each of the gas passages 324, 326, 364 and 366 to prevent undesirable pressure surges during change over of the first and second gases.

The first gas passage 324 of the first flow control section 305 is divided into gas passages 448, 450; the second gas passage 326 of the first flow control section 305 is divided into gas passages 442, 444; the first gas passage 364 of the second flow control section 315 is divided into gas passages 452, 454; and the second gas passage 366 of the second flow control section 315 is divided into gas passages 456, 458. In the embodiment, the gas passage 442 is in fluid communication with the outer zone 46 of the plasma chamber 12, the gas passage 448 is in fluid communication with the inner zone 42 of the plasma processing chamber 12, and the gas passage 444 provides a by-pass line. The gas passage 456 is in fluid communication with the gas passage 442 to the outer zone 46. The gas passage 452 is in fluid communication with the gas passage 448 to the inner zone 42. The gas passages 450, 454 and 458 are in fluid communication with the gas passage 444 to the by-pass line.

A valve 440 is arranged along each of the gas passages 442, 444, 448, 450, 452, 454, 456, and 458. In an alternative embodiment, each of the pairs of valves 440 located along the gas passages 442, 444; 448, 450; 452, 454; and 456, 458 can be replaced by a single, four-way valve. The valves 440 can be selectively opened and closed, preferably under control of the controller 500, to supply the first or second gas to the chamber, while simultaneously diverting the other gas to the by-pass line.

For example, to supply the first gas to the inner zone 42 and the outer zone 46 of the plasma processing chamber 12 and divert the second gas to the by-pass line, the valves 440 along the gas passages 442, 448 and 454, 458 are opened, while the valves 440 along the gas passages 444, 450 and 452, 456 are closed. To switch the gas flow so that the second gas is supplied to the inner zone 42 and the outer zone 46 of the plasma processing chamber 12, while the first gas is diverted to the by-pass line, the valves 440 along the gas passages 444, 450 and 452, 456 are opened, while the valves 440 along the gas passages 442, 448 and 454, 458 are closed. In other words, a first group of valves 440 is opened and a second group of valves 440 is closed to supply the first gas to the plasma processing chamber 12, and then the same first group of valves is closed and the same second group of valves 440 is opened to change the gas flow to supply the second gas to the plasma processing chamber.

In the gas switching system 400, the valves 440 are fast-switching valves. As used herein, the term "fast-switching valve" means a valve that can be opened or closed within a short period of time, preferably less than about 100 ms, more preferably less than about 50 ms, after receiving a signal from the controller 500 to open or close. The valves 440 are preferably electronically controlled and actuated by receiving a signal from the controller 500 to open or close. A suitable "fast-switching valve" that can be used in the gas switching system 400 is valve model number FSR-SD-71-6.35, available from Fujikin of America, located in Santa Clara, Calif.

Accordingly, the gas switching system 400 can supply the first gas, e.g., to the interior of the vacuum chamber while diverting the second gas to the by-pass line, and then, preferably under control of the controller 500, quickly switch these gas flows and supply the second gas to the vacuum chamber while diverting the first gas to the by-pass line. The amount of time that the first gas or second gas is supplied to the vacuum chamber before the gases are switched can be controlled by the controller 500. The volume of the gas passages 324, 326, 364, and 366 between the associated orifices 430 and the valves 440 preferably is less than about 10 cm$^3$. As explained above, the gas distribution system can be used with a plasma processing chamber including a plasma confinement zone to replace a gas volume of about ½ liter to about 4 liters within a period of less than about 1 s, more preferably less than about 200 ms, to thereby stabilize the system.

Figure 6:
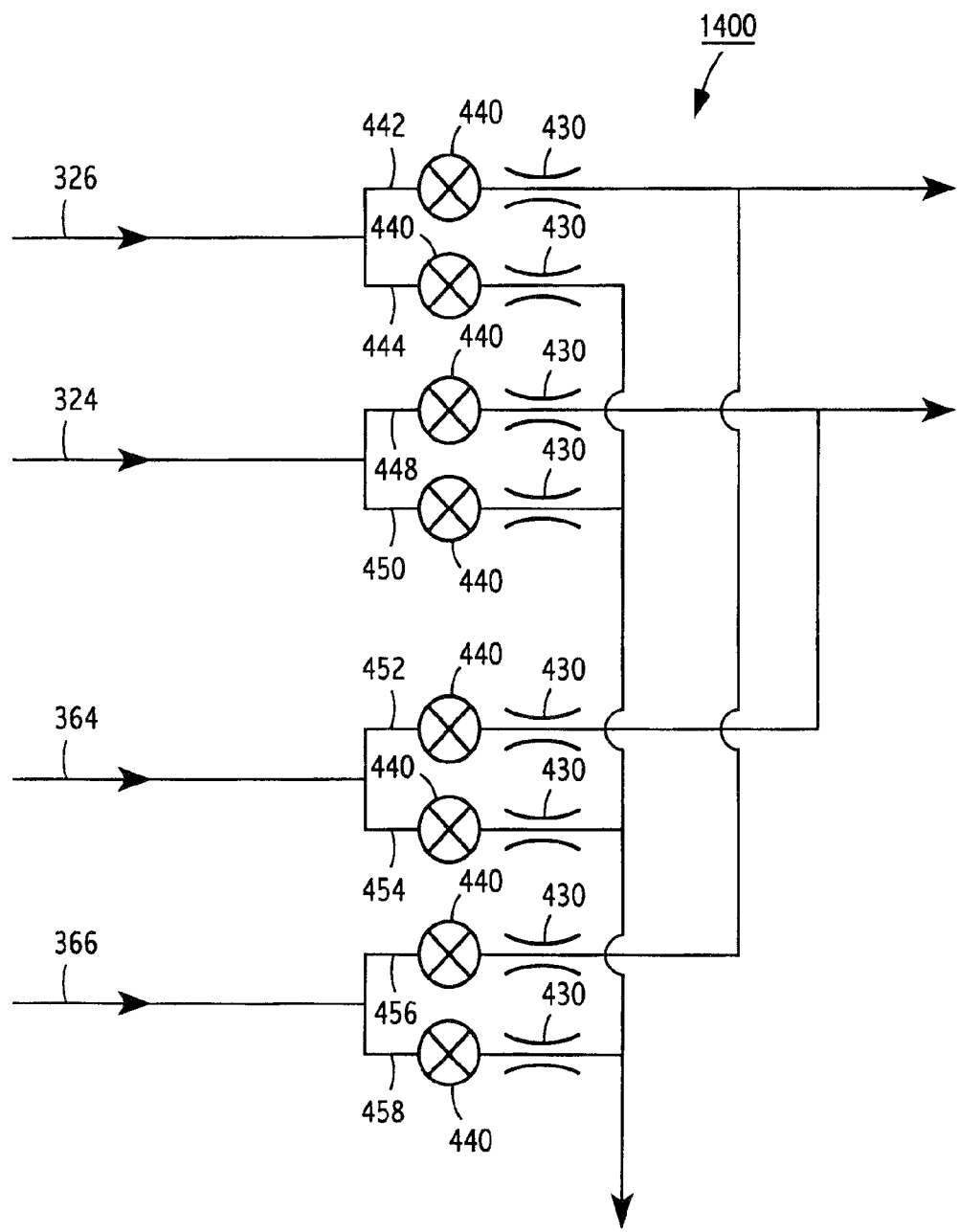
FIG. 6 depicts a second preferred embodiment of the gas switching section of the gas distribution system.

A gas switching system 1400 according to a second preferred embodiment is depicted in FIG. 6. In the gas switching system 1400, a valve 440 and an orifice 430, which is located downstream of the valve 440 are arranged along each of the gas passages 442-458. Otherwise, the gas switching system 1400 can have the same configuration as the gas switching system 400. The orifices 430 prevent undesirable pressure surges during switching of gases. In an alternative embodiment, each of the pairs of valves 440 located along the gas passages 442, 444; 448, 450; 452, 454; and 456, 458 can be replaced by a single, four-way valve.

Figure 7:
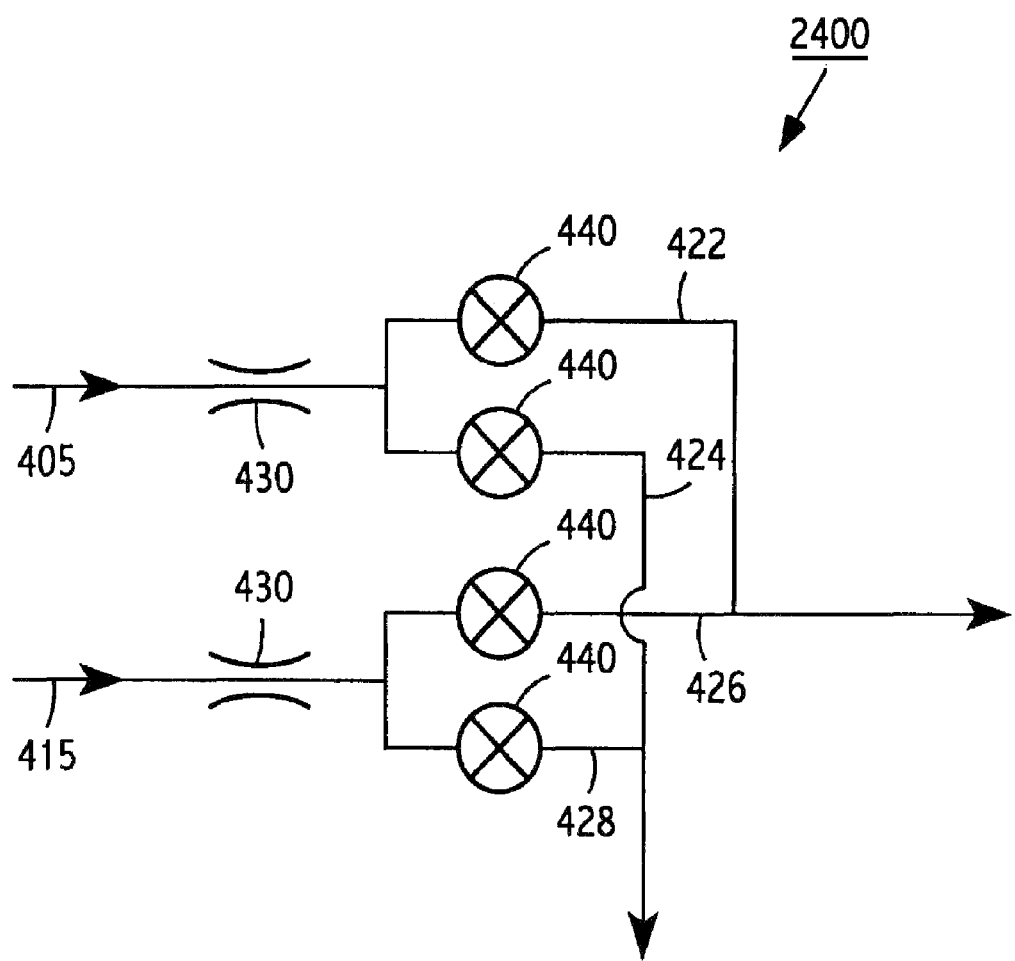
FIG. 7 depicts a third preferred embodiment of the gas switching section of the gas distribution system.

A gas switching system 2400 according to a third preferred embodiment is depicted in FIG. 7. In this embodiment, the gas switching system 2400 is in fluid communication with a first gas passage 405 and a second gas passage 415. The first and second gas passages 405, 415 can be, e.g., a first gas outlet and a second gas outlet, respectively, of a flow control section that, unlike the flow control section 300 shown in FIG. 4, does not include both inner and outer zone gas outlets. An orifice 430 is located along each of the first gas passage 405 and second gas passage 415. The first gas passage 405 is divided into gas passages 422, 424, and the second gas passage 445 is divided into gas passages 426, 428. The gas passages 422 and 426 are in fluid communication with an interior of a vacuum chamber, and the gas passages 424 and 428 are in fluid communication with a by-pass line. A valve 440 is located along each of the gas passages 422, 424 and 426, 428. In an alternative embodiment, each of the pairs of valves 440 located along the gas passages 422, 424; and 426, 428 can be replaced by a single, four-way valve.

For example, to supply the first gas to the vacuum chamber and simultaneously route the second gas to the by-pass line, the valves 440 along the fluid passages 422 and 428 are opened and the valves 440 along the gas passages 424 and 426 are closed. To switch the gas flows so that the second gas is supplied to the vacuum chamber and the first gas is diverted to the by-pass line, the valves 440 along the fluid passages 424 and 426 are opened and the valves 440 along the fluid passages 422 and 428 are closed.

In another preferred embodiment of the gas switching system, the embodiment shown in FIG. 7 can be modified by removing the orifices 430 arranged in the first gas passage 405 and second gas passage 415 upstream of the valves 440, and instead arranging a orifice in each of the gas passages 422, 424, 426 and 428 downstream of the associated valves 440.

Preferred embodiments of the gas distribution system 100 can be used to supply different gas chemistries and/or flow rates to the plasma processing chamber 12 to perform various etching and/or deposition processes. For example, the gas distribution system 100 can supply process gases to a plasma processing chamber to etch features in a silicon oxide, such as an $SiO_2$ layer protected by an overlying mask, such as a UV resist mask. The $SiO_2$ layer can be formed on a semiconductor wafer, such as a silicon wafer, having a diameter of 200 mm or 300 mm. The features can be, e.g., vias and/or trenches. During such etching processes, it is desirable to deposit a polymer on portions of the mask to repair striations, e.g., cracks or fissures, in the mask (i.e., to fill the striations) so that features etched in the $SiO_2$ have their desired shape, e.g., vias have a round cross-section. If striations are not repaired, they can eventually reach the layer underlying the mask and in effect be transferred to that layer during etching. Also, a polymer can be deposited on the sidewalls of the features.

It has been determined, however, that the thickness of the polymer deposited on the sidewalls and the base of etched features affects the etch rate. In anisotropic etching processes, polymer deposited on the bottom of the feature is substantially removed during etching. However, if the polymer becomes too thick on the sidewalls and/or on the base, the etch rate of $SiO_2$ is decreased, and may be stopped completely. Polymer may also flake off of surfaces if it becomes too thick. Accordingly, the amount of time that the gas mixture for forming the polymer deposit on the mask and features is supplied into the plasma processing chamber is preferably controlled to thereby control the thickness of the polymer deposit formed on the $SiO_2$ layer, while also providing sufficient repair and protection of the mask. During etching of the $SiO_2$ layer, polymer is periodically removed from the mask. Accordingly, the polymer is preferably deposited on the mask between periods of etching of the $SiO_2$ layer to ensure that sufficient repair and protection of the mask is achieved.

The gas distribution system 100 can be used to supply process gas into a plasma processing chamber to etch $SiO_2$ protected by an overlying mask, e.g., a UV resist mask, with control of the thickness of polymer deposited on the features, and with repair and protection of the mask. The gas switching system of the gas distribution system 100 is operable to allow a first process gas used to etch the $SiO_2$ to be supplied into the plasma processing chamber for a first period of time while a second gas mixture used to form the polymer deposit is diverted to a bypass line, and then to quickly switch the gas flows so that the second gas mixture is supplied into the plasma processing chamber to form the polymer deposit while the first gas mixture is supplied to the by-pass line. Preferably, the first gas mixture supplied to a plasma confinement zone of the plasma processing chamber is at least substantially replaced with the second gas mixture within a period of less than about 1 s, more preferably less than about 200 ms. The plasma confinement zone preferably has a volume of about ½ liter to about 4 liters.

The first gas mixture used to etch $SiO_2$ can contain, e.g., a fluorocarbon species, such as $C_4F_8$, $O_2$, and argon. The flow ratio of $C_4F_8/O_2$/argon can be, e.g., 20/10/500 sccm. Power is provided with at a combination of frequencies of 60 MHz, 27 MHz, and 2 MHz, at powers that can range from 50 to 5000 W. The second gas mixture used to form a polymer deposit can contain, e.g., a fluorohydrocarbon species, such as $CH_3F$, and argon. The flow ratio of $CH_3F$/argon can be, e.g., 15/500 sccm. The second gas mixture can optionally also include $O_2$. Power is provided at a combination of frequencies of 60 MHz, 27 MHz, and 2 MHz at powers that can range from 50 to 5000 W. For a capacitive-coupled plasma etch reactor for processing 200 mm or 300 mm wafers, the chamber pressure can be, e.g., 70-90 mTorr. The first gas mixture is preferably flowed into the plasma processing chamber for about 5 seconds to about 20 seconds each time it is introduced into the chamber (while the second gas is diverted to the by-pass line), and the second gas mixture is preferably flowed into the plasma processing chamber for about 1 second to about 3 seconds each time it is introduced into the chamber (while the first gas is diverted to the by-pass line). During etching of $SiO_2$ on a substrate, the length of the etching period and/or the polymer deposition period can be increased or decreased within the preferred time periods. The polymer deposit preferably reaches a maximum thickness of less than about 100 angstroms during the etching process, which typically lasts up to about 3 minutes. During etching, polymer can be deposited on the mask to repair striations and provide mask protection. Accordingly, the shape of the openings in the mask preferably can be maintained during the etching process.

The first, second, and third mechanical match boxes 106, 110, 114 are used to provide gross impedance matching between the first, second, and third frequency tuned RF power sources 104, 108, 112 and the load in the plasma processing chamber 12. The first, second, and third mechanical boxes 106, 110, 114 are not able to precisely match the quickly changing impedance load caused by the quickly changing recipe. Therefore, the invention uses frequency tuning provided by the first, second, and third frequency tuned RF power sources 104, 108, 112 to quickly and precisely match the quickly varying impedance of the load and the first, second, and third mechanical match boxes 106, 110, 114 with the impedance of the first, second, and third frequency tuned RF power sources 104, 108, 112.

Since the plasma conditions have to switch very rapidly between deposition and shaping (etch), there are several hardware features which have to work together. The gas volume must be small to reduce gas transition time in the processing chamber. This is achieved by making the plasma volume as small as possible using confinement rings. Also, the RF generators have to be able to rapidly tune in to the rapidly varying plasma conditions. This is achieved by using electronically frequency tuned generators rather than conventional mechanical match units. For best critical dimension control (CD) and uniformity control main gases are split and the ratio of center to edge gas flows are selectable. Finally, a tuning gas is needed which can be the same or different from the main gases and can be fed in a selectable flow to the edge or center of the wafer. So, combination of all the aforementioned hardware constitutes the overall performance desired for applied processes put forth in this document.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method of processing a semiconductor structure in a plasma processing chamber, comprising:
   a) supplying a first process gas into the plasma processing chamber while diverting a second process gas to a bypass-line, the plasma processing chamber containing a semiconductor substrate including at least one layer and a patterned resist mask overlying the layer;
   b) energizing the first process gas to produce a first plasma with a first impedance load and (i) etching at least one feature in the layer or (ii) forming a polymer deposit on the mask;
   c) frequency tuning a first RF power source to a first frequency to match the first impedance load;
   d) frequency tuning a second RF power source to a second frequency different than the first frequency to match the first impedance load;
   e) switching the flows of the first and second process gases so that the second process gas is supplied into the plasma processing chamber while diverting the first process gas to the by-pass line, the first process gas being substantially replaced in a plasma confinement zone of the plasma processing chamber by the second process gas within a period of less than about 1 s;
   f) energizing the second process gas to produce a second plasma with a second impedance load different from the first impedance load and (iii) etching the at least one feature in the layer or (iv) forming a polymer deposit on the layer and the mask;
   g) frequency tuning the first RF power source to a third frequency different than the first and second frequencies to match the second impedance load;
   h) frequency tuning the second RF power source to a fourth frequency different than the first, second, and third frequencies to match the second impedance load;
   i) switching the flows of the first and second process gases so that the first process gas is supplied into the plasma processing chamber while diverting the second process gas to the by-pass line, the second process gas being substantially replaced in the plasma confinement zone of the plasma processing chamber by the first process gas within a period of less than about 1 s; and
   j) repeating b)-i) a plurality of times with the substrate.

2. The method, as recited in claim 1, wherein the periods of less than about 1 s is less than 200 ms.

3. The method, as recited in claim 1, wherein the polymer deposit is formed to a maximum thickness of less than about 100 angstroms after repeating a)-i) a plurality of times with the substrate.

4. The method, as recited in claim 1, further comprising:
   splitting a flow of the first process gas into an inner zone flow and an outer zone flow, wherein the supplying the first process gas into the plasma processing chamber provides the inner zone flow to an inner zone of the processing chamber and the outer zone flow to an outer zone of the processing chamber.

5. The method, as recited in claim 4, further comprising providing a tuning gas to at least one of the inner zone flow of the first process gas and the outer zone flow of the first process gas, wherein the tuning gas is provided after the splitting of the flow of the first process gas.

6. The method of claim 5, wherein the first plasma etches the at least one feature in the layer, and the second plasma forms the deposit on the layer and the mask, the deposit repairing striations in the mask.

7. The method of claim 1, wherein the plasma confinement zone has a volume of about ½ liter to about 4 liters.

8. The method, as recited in claim 1, wherein:
   the first layer is of $SiO_2$;
   the mask is a UV-resist mask;
   the first process gas comprises a mixture of $C_4F_8$, $O_2$ and argon and the first plasma etches the layer; and
   the second process gas comprises a mixture of $CH_3F$, argon, and optionally $O_2$ and the second plasma forms the polymer deposit on the feature and the mask.

9. The method, as recited in claim 1, wherein the frequency tuning the first RF power source to a first frequency to match the first impedance load, and the frequency tuning the first RF power source to a third frequency to match the second impedance load use a matchbox to partially match the first impedance load and third impedance load and use frequency tuning to provide a final match of the first impedance load and second impedance load.

* * * * *